United States Patent
Fu

(10) Patent No.: US 9,541,624 B2
(45) Date of Patent: Jan. 10, 2017

(54) METHOD AND APPARATUS FOR MAGNETIC RESONANCE IMAGING

(71) Applicant: Cai Xia Fu, Shenzhen (CN)

(72) Inventor: Cai Xia Fu, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 644 days.

(21) Appl. No.: 14/037,619

(22) Filed: Sep. 26, 2013

(65) Prior Publication Data

US 2014/0084922 A1 Mar. 27, 2014

(30) Foreign Application Priority Data

Sep. 26, 2012 (CN) .......................... 2012 1 0362793

(51) Int. Cl.
*G01R 33/56* (2006.01)
*G01R 33/565* (2006.01)
*G01R 33/561* (2006.01)

(52) U.S. Cl.
CPC ..... *G01R 33/56527* (2013.01); *G01R 33/5607* (2013.01); *G01R 33/5613* (2013.01); *G01R 33/56509* (2013.01)

(58) Field of Classification Search
CPC ............ G01R 33/5627; G01R 33/5607; G01R 33/5613; G01R 33/56509; G01R 33/56527; G01R 33/5602
See application file for complete search history.

(56) References Cited

U.S. PATENT DOCUMENTS

| | | | |
|---|---|---|---|
| 6,272,369 B1 | 8/2001 | Tan | |
| 7,292,039 B1 | 11/2007 | Laub et al. | |
| 7,706,855 B1 | 4/2010 | Priatna et al. | |
| 2005/0070785 A1* | 3/2005 | Ahluwalia | G01R 33/4828 600/410 |
| 2008/0150531 A1* | 6/2008 | Hughes | G01R 33/4824 324/309 |
| 2008/0224699 A1* | 9/2008 | Hughes | G01R 33/4828 324/309 |
| 2008/0238421 A1* | 10/2008 | Kitane | G01R 33/4828 324/307 |

(Continued)

FOREIGN PATENT DOCUMENTS

CN 102772206 A 11/2012

OTHER PUBLICATIONS

Greg Brown, "Fat Suppression Techniques," New Zealand MR Users Meeting, Auckland, NZ, (1996).

(Continued)

*Primary Examiner* — Clayton E LaBalle
*Assistant Examiner* — Ruifeng Pu
(74) *Attorney, Agent, or Firm* — Schiff Hardin LLP

(57) ABSTRACT

In a method and apparatus for magnetic resonance imaging, a flip angle and/or inversion time of a spectrum suppression pulse is calculated according to a steady state condition of a longitudinal magnetization component of a spectrum composition suppressed by the spectrum suppression pulse and a zero crossing point condition of the longitudinal magnetization component. Raw magnetic resonance image data are acquired by applying a magnetic resonance imaging sequence that includes the spectrum suppression pulse provided with the flip angle and/or the inversion time.

7 Claims, 4 Drawing Sheets

(56) References Cited

U.S. PATENT DOCUMENTS

| | | | |
|---|---|---|---|
| 2010/0013478 A1* | 1/2010 | Abe | G01R 33/4828 324/309 |
| 2010/0268062 A1* | 10/2010 | Edelman | G01R 33/5635 600/410 |
| 2010/0296717 A1* | 11/2010 | Takizawa | G01R 33/4824 382/131 |
| 2011/0133735 A1 | 6/2011 | Yokosawa et al. | |
| 2012/0161760 A1* | 6/2012 | Kuhara | A61B 5/055 324/307 |
| 2012/0194187 A1* | 8/2012 | Rehwald | G01R 33/5602 324/309 |
| 2013/0274592 A1* | 10/2013 | Shin | A61B 5/055 600/420 |
| 2014/0062474 A1* | 3/2014 | Zhou | A61B 5/055 324/309 |
| 2014/0133725 A1* | 5/2014 | Feiweier | G01R 33/50 382/131 |
| 2015/0042336 A1* | 2/2015 | Feiweier | G01R 33/4833 324/309 |
| 2015/0131884 A1* | 5/2015 | Kimura | A61B 5/055 382/131 |
| 2015/0216428 A1* | 8/2015 | Zhou | A61B 5/0263 600/413 |
| 2015/0301138 A1* | 10/2015 | Griswold | G01R 33/56563 324/309 |

OTHER PUBLICATIONS

Haacke et al., "Magnetic Resonance Imaging: Physical Principles and Sequence Design," Chapter 4 (1999).

* cited by examiner

METHOD AND APPARATUS FOR MAGNETIC RESONANCE IMAGING

BACKGROUND OF THE INVENTION

Field of the Invention

The present invention relates to a method and apparatus for magnetic resonance imaging, and particularly, to a method and apparatus for magnetic resonance imaging that make use of a spectrum suppression pulse.

Description of the Prior Art

Magnetic resonance imaging is a bio-magnetic nuclear spin imaging technology developed rapidly along with the development of computed technology, electronic circuit technology, and superconductor technology. In magnetic resonance imaging, human tissue is placed in a static magnetic field $B_0$, and hydrogen nuclei within the human tissue are then excited by a radio-frequency pulse with the same frequency as the precession frequency of the hydrogen nuclei, so as to cause resonance of the hydrogen nuclei (nuclear spins) and absorption of energy, which causes the nucleus spins to be deflected out of alignment with the static field by an amount known as "flip angle." After the radio-frequency pulse ceases, the hydrogen nuclei emit a radio signal at a specific frequency and release the absorbed energy, which is detected as a radio-frequency signal that is processed by a computer to obtain an image in magnetic resonance imaging.

In order to obtain an image of better quality, signals having a specific spectral composition, such as fat signals, water signals, silica gel signals (breast implants) and so on, often need to be suppressed. For example, in magnetic resonance imaging examinations used for the abdomen, the chest, etc., it is generally required to suppress fat signals, so as to display tissues or lesions of interest in a highlighted way. Many fat suppression techniques have been proposed, such as the FatSat (fat saturation) technique, SPAIR (Spectral Presaturation Attenuated Inversion Recovery) technique, STIR (short inversion time inversion recovery) technique, Dixon water-fat separation technique, and so on. Except for the Dixon technique, the efficacy of all the other techniques is dependent on the flip angle (such as for FatSat) or inversion time (such as for inversion recovery techniques like SPAIR, STIR, etc.) of a fat suppression pulse applied to the human tissue. It is well known that a flip angle refers to the angle of a macro magnetization vector deviating from the static magnetic field $B_0$ under the excitation of a radio-frequency pulse. The size of the flip angle is determined by the intensity and action time of the applied radio-frequency pulse. Inversion time is the time interval between a 180 degree inversion pulse and an excitation pulse in an inversion recovery pulse sequence.

As described above, optimization of fat suppression can be achieved by optimizing the flip angle or inversion time of the fat suppression pulse. In response to this situation, a method for calculating a flip angle of a FatSat pulse has now been proposed. However, this method only takes into consideration the calculation method of the flip angle of the FatSat pulse when a spin echo sequence is used for magnetic resonance imaging, without taking into account a number of excitation pulses applied following each fat suppression pulse in an abdomen magnetic resonance imaging applying a spoiled gradient echo sequence (Spoiled GRE, such as VIBE sequence) of a short radio-frequency pulse interval (TR). Furthermore, the method cannot be used to optimize the inversion time of the fat suppression pulse (such as for inversion recovery pulses like SPAIR, STIR, etc.).

SUMMARY OF THE INVENTION

A method for magnetic resonance imaging in accordance with the present invention includes calculating a flip angle and/or inversion time of a spectrum suppression pulse according to a steady state condition of a longitudinal magnetization component of a spectrum composition suppressed by a spectrum suppression pulse and a zero crossing point condition of the longitudinal magnetization component, and acquiring raw magnetic resonance image data by applying a magnetic resonance imaging sequence that includes the spectrum suppression pulse provided with the flip angle and/or the inversion time.

The present invention further encompasses a device for magnetic resonance imaging that has a calculation unit configured to calculate a flip angle and/or inversion time of a spectrum suppression pulse according to a steady state condition of a longitudinal magnetization component of a spectrum composition suppressed by the spectrum suppression pulse and a zero crossing point condition of the longitudinal magnetization component; and a magnetic resonance data acquisition unit operated by a control unit to acquire raw magnetic resonance image data by applying a magnetic resonance imaging sequence that includes the spectrum suppression pulse provided with the flip angle and/or the inversion time.

The spectrum suppression pulse can be a spectrum saturation pulse including, for example, a fat saturation pulse and a water saturation pulse, and a spectrum suppression pulse including a spectrum presaturation attenuated inversion recovery pulse, a short inversion time inversion recovery pulse, and a fluid attenuated inversion recovery pulse.

As can be seen from the abovementioned solution, since the method and device for magnetic resonance imaging in the present invention use a spectrum suppression pulse with an optimized flip angle and/or inversion time to suppress the corresponding spectrum composition signal as much as possible, images of a high quality can be obtained.

DESCRIPTION OF THE PREFERRED EMBODIMENTS

In order to make the object, technical solutions and advantages of the present invention more apparent, the present invention will be further described in detail hereinbelow by way of embodiments.

(Embodiment 1)

This embodiment describes a fat suppression pulse as a specific spectrum suppression pulse.

First, MRI sequences involved in the present invention will be briefly described.

Figure 1:
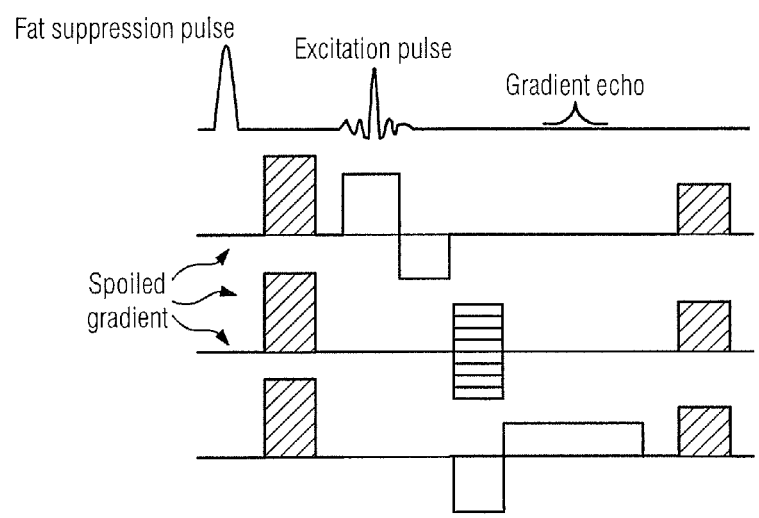
FIG. 1 is a schematic diagram of a spoiled gradient echo sequence provided with a fat suppression pulse.

FIG. 1 is a schematic diagram of a spoiled gradient echo sequence provided with a fat suppression pulse. Since the radio-frequency pulse interval TR of the spoiled gradient echo sequence is relatively short and a plurality of excitation pulses can be applied between continuous fat suppression pulses, the measurement time is reduced. Therefore, the sequence is suitable for MRI examinations of the abdomen, the chest and so on which need a short sampling time in order to avoid motion artifacts.

As shown in FIG. 1, at first a fat suppression pulse is applied, and the transverse magnetization vector generated in the XY plane due to the application of the fat suppression pulse is eliminated by the spoiled gradient. And then, radio-frequency excitation pulses, slice selection gradients, phase encoding gradients, etc. constituting a gradient echo sequence are applied (for clarity, only one excitation pulse is shown in the figure), and after the excitation pulses are applied, a gradient echo as shown in FIG. 1 is generated.

Figure 2:
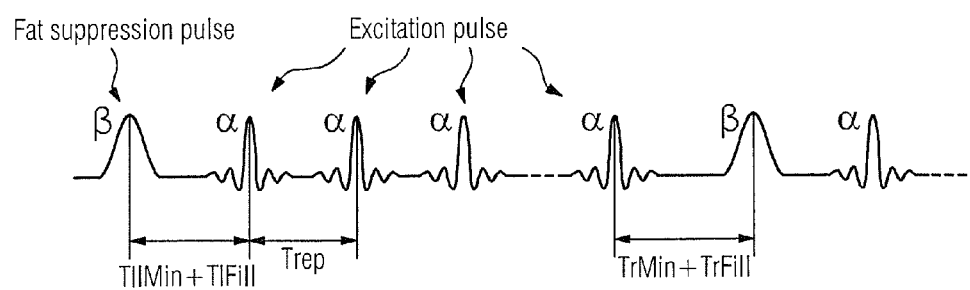
FIG. 2 shows a sequence chart with a number of excitation pulses being applied between continuous fat suppression pulses.

FIG. 2 illustrates a sequence chart with a number of excitation pulses being applied between continuous fat suppression pulses. To simplify the accompanying drawing, gradient pulses (selective gradient, phase encoding gradient, spoiled gradient, and so on) and the radio-frequency spoil mechanism are not shown in FIG. 2.

As can be seen from FIG. 2, a pulse train in the sequence is constituted by a fat suppression pulse and a number of radio-frequency excitation pulses. The fat suppression pulse is for example, an aforementioned FatSat pulse, SPAIR pulse, STIR pulse and so on. The β shown in the figure is the flip angle of the fat suppression pulse, and α is the flip angle of the excitation pulses.

As shown in FIG. 2, Tl1 represents the time interval between the center of a fat suppression pulse and the center of the first excitation pulse following the fat suppression pulse, Tr represents the time interval between the center of the last excitation pulse in a pulse train and the center of a fat suppression pulse in a next pulse train of a magnetic resonance imaging sequence, and Trep represents the time between continuous excitation pulses. Furthermore, in the present invention, Tl1Min is used to represent the minimum value of Tl1, and TlFill represents a first inversion time. It is apparent that Tl1 Min+TlFill=Tl1. Similarly, in the present invention, TrMin is used to represent the minimum value of Tr, TrFill represents a second inversion time, and TrMin+TrFill=Tr.

Hereinafter, k-Space and the k-space center line involved in the present invention will be briefly described.

The mathematical domain known as k-space, also referred to as Fourier space, is an organized set of storage locations in an electronic memory that are filled by the raw data of magnetic resonance signals that are acquired while the pulse sequence is being executed. The entered and stored raw data are converted into images after the Fourier transform is carried out thereon. In the process of acquiring two-dimensional image signals, the size and direction of the frequency encoding gradient field of each magnetic resonance signal remain the same, while the intensity of the phase encoding gradient changes in certain steps, the phase encoding of each magnetic resonance signal changes once, and the captured magnetic resonance signals fill in a line of the k-space in a $K_y$ direction. In the present invention, each excitation pulse of a number of excitation pulses corresponds to a line in the k-space. Contributions of data in different locations of the k-space to the final image are different: data in the center of the k-space mainly determines the signal to noise ratio and contrast information of the image, and signals at the edges of the k-space mainly contribute to information in the aspect of resolution capability of the image.

The optimized fat suppression pulse used in the method for magnetic resonance imaging according to this embodiment will be described below. As described above, the energy efficiency of fat suppression depends largely on the flip angle and inversion time of the fat suppression pulse; hence, the optimization of fat suppression can be achieved by optimizing the flip angle or the inversion time of the fat suppression pulse. Therefore, how to determine the optimized flip angle and inversion time becomes essential. In this regard, this embodiment proposes a general solution, which can be used not only to calculate the flip angle of a fat suppression pulse (such as for FatSat) but also to calculate the inversion time of the fat suppression pulse (for inverted pulses including SPAIR and STIR), and which, at the same time, takes into consideration the situation where each fat suppression pulse in the spoiled gradient echo sequence is followed by a plurality of excitation pulses. The general solution is first described below.

1. Fat Composition Magnetization Vector Expression Deduced from Bloch Equation

Assume that the spoil mechanism of the spoiled gradient echo sequence works ideally, so that the transverse magnetization component in the XY plane is completely spoiled before each excitation pulse (α pulse) and does not contribute to the subsequent excitation pulses. Also assume that the fat suppression pulse (β pulse) only excites the fat composition. In such conditions, according to the classical Bloch equation, the longitudinal magnetization vector representation of the fat composition before each pulse can be as follows:

$$M_\beta(1) = M_0 \quad (1)$$

$$M_\alpha(1) = M_0(1-E_{Tl1}) + M_\beta(m) \cdot \cos(\beta) \cdot E_{Tl1} \quad (2)$$

$$M_\alpha(n) = M_0(1-E_{Trep}) + M_\alpha(n-1) \cdot \cos(\alpha) \cdot E_{Trep} \quad (3)$$

$$M_\beta(m+1) = M_0(1-E_{Tr}) + M_\alpha(N) \cdot \cos(\alpha) \cdot E_{Tr} \quad (4)$$

where:
$E_{Tl1} = \exp(-Tl1/T1)$
$E_{Trep} = \exp(-Trep/T1)$
$E_{Tr} = \exp(-Tr/T1)$
T1: longitudinal relaxation time of fat tissue,
$M_0$: initial magnetization vector of fat tissue,
$M_\alpha(n)$: longitudinal magnetization component of fat before the nth α pulse,
$M_\beta(m)$: longitudinal magnetization component of fat before the mth β pulse, and
N: the number of α pulses between two β pulses, i.e. the number of k-space lines filled by each pulse train.

2. Establishment of general formula

Since $M_0$ will be offset during calculation, it can be set as 1, i.e. $M_0=1$.

Therefore, equations (1) to (4) can be written as $$M_\beta(1) = 1 \quad (5)$$

$$M_\alpha(1) = A + B \cdot M_\beta(m) \quad (6)$$

$$M_\alpha(n) = C + D \cdot M_\alpha(n-1) \quad (7)$$

$$M_\beta(m+1) = E + F \cdot M_\alpha(N) \quad (8)$$

where
A=1−$E_{Tl1}$  B=cos(β)·$E_{Tl1}$
C=1−$E_{Trep}$  D=cos(α)·$E_{Trep}$
E=1−$E_{Tr}$  F=cos(α)·$E_{Tr}$ According to equations (6) and (7), the following can be deduced:

$$M_\alpha(1) = A + B \cdot M_\beta(m) \quad (9)$$

$$M_\alpha(2) = C + D \cdot M_\alpha(1)$$
$$= C + A \cdot D + B \cdot D \cdot M_\beta(m)$$

$$M_\alpha(3) = C + D \cdot M_\alpha(2)$$
$$= C + C \cdot D + A \cdot D^2 + B \cdot D^2 \cdot M_\beta(m)$$

$$M_\alpha(4) = C + D \cdot M_\alpha(3)$$
$$= C + C \cdot D + C \cdot D^2 + A \cdot D^3 + B \cdot D^3 \cdot M_\beta(m)$$

... ...

$$M_\alpha(n) = C + C \cdot D + C \cdot D^2 + C \cdot D^3 \ldots + C \cdot D^{n-2} +$$
$$A \cdot D^{n-1} + B \cdot D^{n-1} \cdot M_\beta(m)$$
$$= C(D^{n-1} - 1)/(D - 1) + A \cdot D^{n-1} + B \cdot D^{n-1} \cdot M_\beta(m)$$

(where, n=1, 2, 3, . . . , and D≠1, because cos(α)·$E_{Trep}$≠1)

According to equations (8) and (9), the following can be deduced:

$$M_\beta(m+1) = E + F \cdot M_\alpha(N) \quad (10)$$
$$= E + F \cdot \{C \cdot (D^{N-1} - 1)/(D - 1) +$$
$$A \cdot D^{N-1} + B \cdot D^{N-1} \cdot M_\beta(m)\}$$
$$= E + F \cdot C \cdot (D^{N-1} - 1)/(D - 1) +$$
$$F \cdot A \cdot D^{N-1} + F \cdot B \cdot D^{N-1} \cdot M_\beta(m)$$

The above equations are deduced by introducing a steady state condition and a zero crossing point condition of a longitudinal magnetization component in the present invention.

The steady state condition is known in the art. In particular, when in a steady state, the longitudinal magnetization component of fat before each β pulse should be the same; therefore, the steady state condition is:

$$M_\beta(m+1) = M_\beta(m). \quad (11)$$

Furthermore, based on the features of the aforementioned k-space and k-space filling line, it is recognized that when the longitudinal magnetization component of fat before an excitation pulse corresponding to one or more k-space filling lines is zero, it is possible to obtain optimized fat suppression. In particular, when the longitudinal magnetization component of fat before an excitation pulse corresponding to a k-space center line is zero, it has the best fat suppression. Therefore, the zero crossing point condition of the longitudinal magnetization component can be set as:

$$M_\alpha(KSpaceCenterLine) = 0 \quad (12)$$

where, KSpaceCenterLine is the index number of a k-space center line.

According to steady state condition (11) and equation (10), the following can be deduced:

$$M_{R\beta}(m) = E + F \cdot C \cdot (D^{N-1} - 1)/(D - 1) + F \cdot A \cdot D^{N-1} + F \cdot B \cdot D^{N-1} \cdot M_\beta(m),$$

thereby $$M_\beta(m) = \{E + F \cdot C \cdot (D_{N-1} - 1)/(D - 1) + F \cdot A \cdot D^{N-1}\}/(1 - F \cdot B \cdot D^{N-1}) \quad (13)$$

In addition, the following can be deduced by combing zero crossing point condition (12) of the longitudinal magnetization component and equation (9):

$$0 = C \cdot (D^{KSpaceCenterLine-1} - 1)/(D-1) + A \cdot D^{KSpaceCenterLine-1} + B \cdot D^{KSpaceCenterLine-1} \cdot M_\beta(m)$$

thereby $$M_\beta(m) = \{C \cdot (D^{KSpaceCenterLine-1} - 1)/(D-1) + A \cdot D^{KSpaceCenterLine-1}\}/(-B \cdot D^{KSpaceCenterLine-1}) \quad (14)$$

According to equations (13) and (14), the following can be deduced:

$$\{E + F \cdot C \cdot (D^{N-1} - 1)/(D-1) + F \cdot A \cdot D^{N-1}\}/(1 - F \cdot B \cdot D^{N-1})$$
$$= \{C \cdot (D^{KSpaceCenterLine-1} - 1)/(D-1) + A \cdot D^{KSpaceCenterLine-1}\}/(-B \cdot D^{KSpaceCenterLine-1}) \quad (15)$$

The final general formula (15) is thereby deduced. With this formula, a person skilled in the art can easily calculate the flip angle β and the inversion time TIFill and TrFill. Nevertheless, for clarity, the flip angle β of a FatSat pulse and the inversion time TIFill and TrFill of a SPAIR pulse are hereinafter taken as an example, to give examples of calculating the flip angle and the inversion time.

Flip angle β of FatSat pulse:

For a spoiled gradient echo sequence provided with a FatSat pulse, the following parameters can be determined in advance according to the conditions of the magnetic resonance imaging hardware and user requirements and so on: Trep, α, KSpaceCenterLine, N, Tr=TrMin, Tl1=Tl1Min.

According to equation (15), the following can be deduced:

$$\beta = \arccos(X/E_{Tl1})$$

where
X=G1/(G1·G4−G2·G3)
G1=C($D^{KSpaceCenterLine-1}$ − 1)/(D−1)+A·$D^{KSpaceCenterLine-1}$
G2=$D^{KSpaceCenterLine-1}$
G3=E+F·C·($D^{N-1}$ − 1)/(D−1)+F·A·$D^{N-1}$
G4=F·$D^{N-1}$ Therefore, β can be calculated easily.

First inversion time TIFill and second inversion time TrFill of SPAIR pulse:

For a spoiled gradient echo sequence provided with a SPAIR pulse, the following parameters can be determined in advance according to the conditions of the magnetic resonance imaging hardware and user requirements and so on: Trep, α, β=180°, KspaceCenterLine, N, TrMin, Tl1Min. Also, as described above, Tl1=TIFill+Tl1Min, and Tr=TrFill+TrMin.

The influence of TIFill and TrFill on the position where the longitudinal magnetization component of fat is zero is opposite, i.e., a longer TrFill will increase line indexes with a zero fat signal, while a longer TIFill will decrease line indexes with a zero fat signal. Also, for any parameter set, the result of the inversion time will be (TIFill>=0, TrFill=0) or (TIFill=0, TrFill>=0).

Therefore, the first inversion time TIFill and the second inversion time TrFill of the SPAIR pulse can be calculated in the following steps:

Step A: maintaining TrFill=0, i.e. Tr=TrMin, and calculating TIFill.

According to equation (15), the following can be deduced:

$$TlFill = Tl1 - Tl1Min = -T1 \cdot \ln(X/\cos(\beta)) - Tl1Min$$

where
$X = (G1+G2)/\{G1 \cdot G4 + G2/\cos(\beta) - G2 \cdot G3\}$
$G1 = C \cdot (D^{KSpaceCenterLine-1} - 1)/(D-1)$
$G2 = D^{KSpaceCenterLine-1}$
$G3 = E + F \cdot C \cdot (D^{N-1} - 1)/(D-1)$
$G4 = FD^{N-1}$ Therefore, TlFill can be calculated easily. If TlFill>=0, it means that the current parameter set has calculated the inversion time, where TlFill>=0 and TrFill=0; and if TlFill<0, it means that when TrFill=0, the result set (TlFill, TrFill=0) from the calculation does not meet the requirements, and therefore step B needs to be performed.

Step B: maintaining TlFill=0, i.e. Tl1=TlMin, and calculating TrFill.

According to equation (15), the following can be deduced:

$$TrFill = Tr - TrMin = -T1 \ln(Y/\cos(\beta)) - TrMin$$

where
$Y = (G1+G2)/(G1 \cdot G4 - G2 \cdot G3)$
$G1 = C \cdot (D^{KSpaceCenterLine-1} - 1)/(D-1) + A \cdot D^{KSpaceCenterLine-1}$
$G2 = B \cdot D^{KSpaceCenterLine-1}$
$G3 = C \cdot (D^{N-1} - 1)/(D-1) + A \cdot D^{N-1} - 1/\cos(\alpha)$
$G4 = B \cdot D^{N-1}$ Therefore, TrFill can be calculated easily. If TrFill>=0, it means that the current parameter set has calculated the inversion time, where TlFill=0 and TrFill>=0; and if TlFill<0, it means that for the current parameter set there is no corresponding inversion time, and the result will be TrFill=0, and TlFill=0.

It should be noted that, although in the above example, TrFill=0 is maintained to calculate the corresponding TlFill in step A, and then in step B TlFill is maintained to calculate the corresponding TrFill, this is only an example. It is also permitted, in step A, to maintain TlFill=0 and calculate the corresponding TrFill, and then if necessary, in step B, maintain TrFill and calculate the corresponding TrFill.

The foregoing has described in detail the general solution for calculating an optimized flip angle and inversion time. A method for magnetic resonance imaging according to this embodiment will be described below with reference to FIG. 3.

Figure 3:
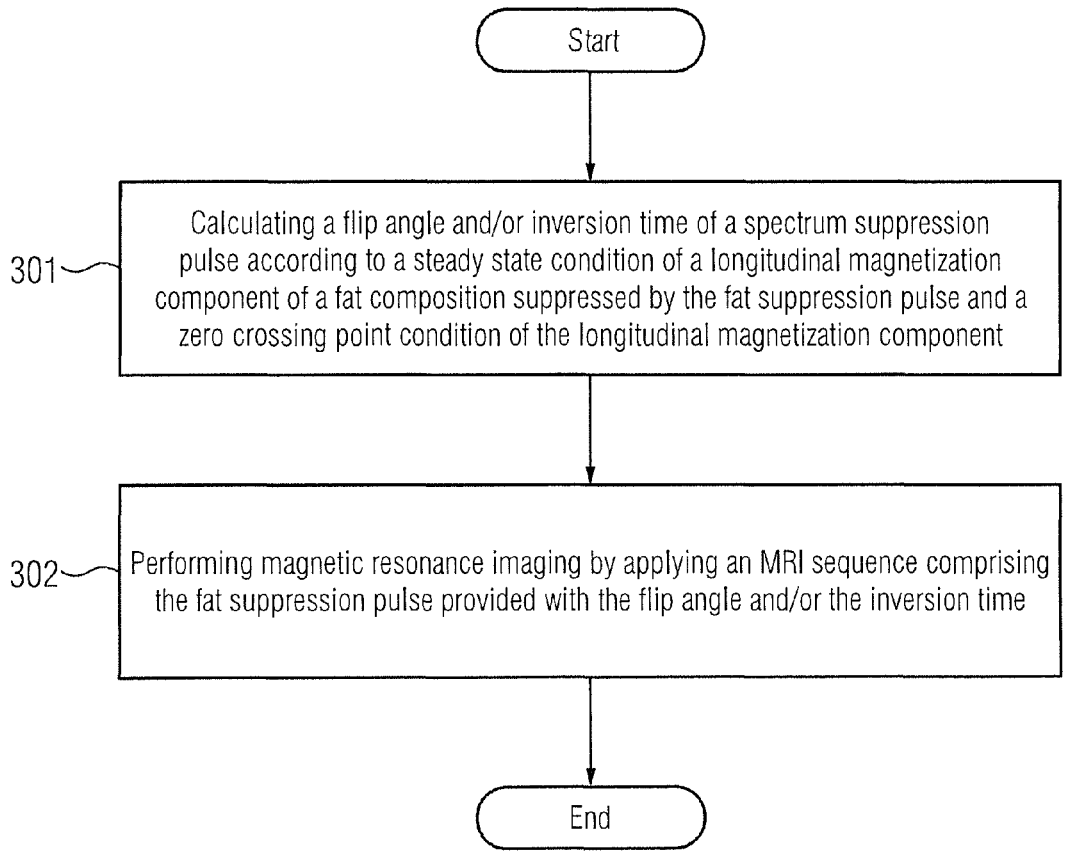
FIG. 3 shows a flow chart of a method for magnetic resonance imaging using an MRI sequence provided with a spectrum suppression pulse according to the embodiments of the present invention.

As shown in FIG. 3, in step 301, a flip angle or inversion time of a spectrum suppression pulse is calculated according to a steady state condition of a longitudinal magnetization component of a fat composition suppressed by the fat suppression pulse and a zero crossing point condition of the longitudinal magnetization component. In this step, various parameters of the fat suppression pulse are determined in advance. The parameters include, for example, the number N of excitation pulses between two fat suppression pulses, the minimum time interval Tl1Min between the center of a fat suppression pulse and the center of the first excitation pulse following the fat suppression pulse, the time interval TrMin between the center of the last excitation pulse in a pulse train and the center of a fat suppression pulse in the next pulse train of an MRI sequence, time Trep between continuous excitation pulses, flip angle α of an excitation pulse, index number KSpaceCenterLine of a k-space center line, and so on. And then, a flip angle or inversion time of the fat suppression pulse based on the various parameters is calculated according to a steady state condition of a longitudinal magnetization component of fat and a zero crossing point condition of the longitudinal magnetization component. In particular, a magnetization vector representation of fat is deduced according to the Bloch equation, and a general formula for calculating a flip angle or inversion time of a fat suppression pulse is deduced by applying a steady state condition of a longitudinal magnetization component of fat and a zero crossing point condition of the longitudinal magnetization component, and then the flip angle or the inversion time is calculated according to the various parameters determined. Applying a steady state condition $M_\beta(m+1) = M_\beta(m)$ of a longitudinal magnetization component of fat and a zero crossing point condition $M_\alpha(KSpaceCenterLine) = 0$ of the longitudinal magnetization component is a key to obtain an optimized flip angle and inversion time. And then, in step 302, magnetic resonance imaging is performed by applying an MRI sequence comprising the fat suppression pulse provided with the flip angle or the inversion time. An exemplary manner for applying fat suppression pulses in the MRI sequence is to follow each fat suppression pulse with one or more excitation pulses. The MRI sequence can be any sequence, as long as it can spoil the residual transverse magnetization components before applying the next excitation pulse. For example, the MRI sequence can be a spoiled fast spin echo (TSE) sequence, a spoiled gradient echo (GRE) sequence, etc.

(Embodiment 2)

The abovementioned embodiment 1 describes a method for optimizing a fat suppression pulse, and the optimization method can be applied to a water suppression pulse.

In magnetic resonance imaging, in addition to fat suppression, water signals of a human tissue may need to be suppressed by applying, for example, a water saturation pulse and a FLAIR (fluid attenuated inversion recovery) pulse. The general formula (15) given in embodiment 1 of the present invention is applicable to both the water saturation pulse and the FLAIR pulse. More specifically, for the water saturation pulse, an optimized flip angle can be calculated using the same method as the solution for FatSat described in embodiment 1, so as to obtain an optimized water suppression pulse, and imaging can be performed by applying the magnetic resonance imaging method described with reference to FIG. 3 in embodiment 1; and similarly, for FLAIR, optimized Tlfill and Trfill values can be calculated using the same method as the solution for SPAIR described in embodiment 1, so as to obtain an optimized water suppression pulse, and the water suppression pulse can be optimized by applying the magnetic resonance imaging method described with reference to FIG. 3 in embodiment 1.

In fact, in addition to the fat suppression pulse and the water suppression pulse, the optimization method described in embodiment 1 of the present invention can be applied to any particular spectrum suppression pulses, and all that needs to be done is to change parameters such as T1 or the center frequency of the suppression pulse and so on. That is to say, the method for magnetic resonance imaging described in embodiment 1 of the present invention can actually be applied to any spectrum suppression pulses.

The method for magnetic resonance imaging according to the present invention has been described in detail above. In the method for magnetic resonance imaging, signals of a specific spectrum composition can be well suppressed by performing imaging using an MRI sequence provided with an optimized spectrum suppression pulse, so that high-quality images can be obtained.

Figure 4:
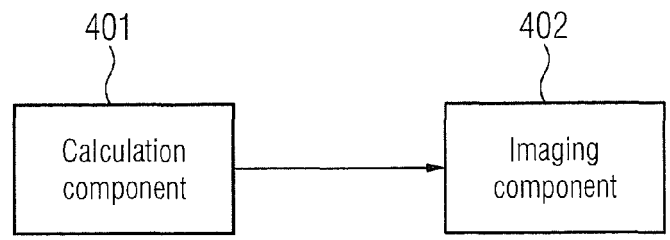
FIG. 4 shows a block diagram of a device for magnetic resonance imaging using an MRI sequence provided with a spectrum suppression pulse.

FIG. 4 shows a device 400 for magnetic resonance imaging using an MRI sequence provided with a spectrum suppression pulse. As shown in FIG. 4, the device for magnetic resonance imaging comprises: a calculation component 401 for calculating a flip angle or inversion time of a spectrum suppression pulse according to a steady state condition of a longitudinal magnetization component of a spectrum composition suppressed by the spectrum suppression pulse and an optimized spectrum suppression condition; and an imaging component 402 for performing magnetic resonance imaging by applying a magnetic resonance imaging sequence comprising the spectrum suppression pulse provided with the flip angle or the inversion time.

As described above, the optimization method of a spectrum suppression pulse according to one aspect of the present invention has good universality and can be widely used. Also, the energy efficiency of spectrum signal suppression is improved by optimizing the spectrum suppression pulse. In addition, signals of a specific spectrum composition can be well suppressed by performing imaging using an MRI sequence provided with an optimized spectrum suppression pulse, so that high-quality images can be obtained. MATLAB simulation results and in vivo test results from the application of the abovementioned method of the present invention will be described below with reference to FIGS. 5 to 7.

MATLAB Simulation Results

Figure 5A:
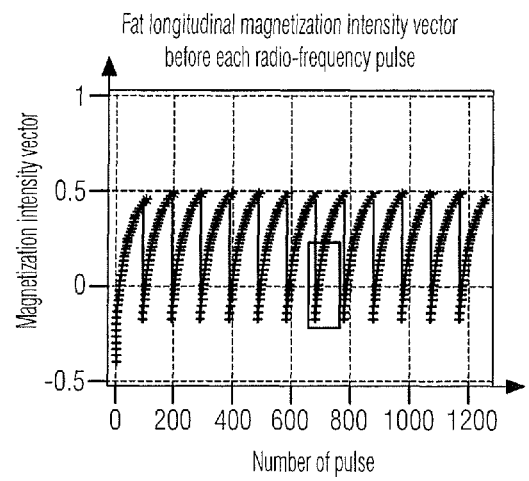
FIGS. 5(a) and 5(b) show the simulation results when a spectrum suppression pulse is a FatSat pulse.
Figure 5B:
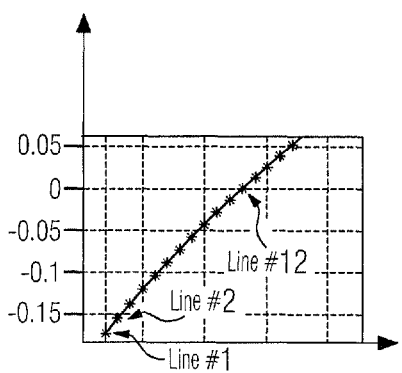

FIGS. 5(a) and 5(b) show the simulation results when the spectrum suppression pulse is a FatSat pulse. The various parameters are set as follows: using a spoiled 3D gradient echo sequence for imaging, α=9°, the number of k-space filling lines corresponding to each pulse train=32, KSpaceCenterLine=#12, Trep=3.92 ms, TrMin=12.298 ms, TI1min=10.482 ms, and T1=290.0 ms(3T). The FatSat flip angle calculated according to the abovementioned general formula (15) of the present invention is: β=153.113°, wherein the fat signal at line #12 is 0%.

FIG. 5(a) is the simulation result of the fat signals with the abovementioned given parameters and the calculated flip angle. FIG. 5(b) is an enlarged schematic diagram of the curve within the rectangle box shown in FIG. 5(a).

Figure 6A:
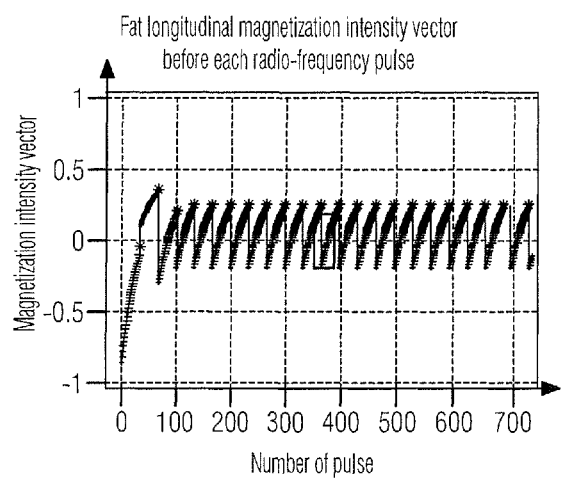
FIGS. 6(a) and 6(b) show the simulation results when a spectrum suppression pulse is a SPAIR pulse.
Figure 6B:
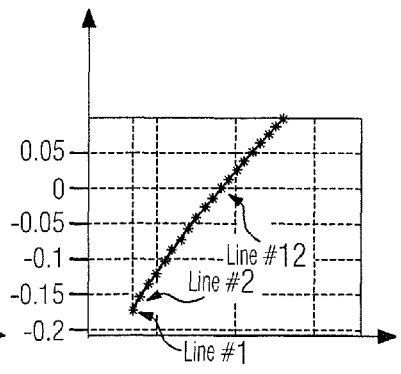

FIGS. 6(a) and 6(b) show the simulation results when the spectrum suppression pulse is a SPAIR pulse. The various parameters are set as follows: using a spoiled 3D gradient echo sequence for imaging. α=9°, β=180°, the number of k-space filling lines corresponding to each pulse train=32, KSpaceCenterLine=#12, Trep=3.92 ms, TrMin=14.918 ms, TI1min=17.342 ms, and T1=290.0 ms(3T). The inversion time calculated according to the abovementioned general formula (15) of the present invention is: TrFill=0, TIFill=0.91 ms, wherein the fat signal at line #12 is 0%.

FIG. 6(a) is the simulation result of the fat signals with the abovementioned given parameters and the calculated TrFill and TIFill. FIG. 6(b) is an enlarged schematic diagram of the curve within the rectangle box shown in FIG. 6(a).

In Vivo Test Results

Figure 7A:
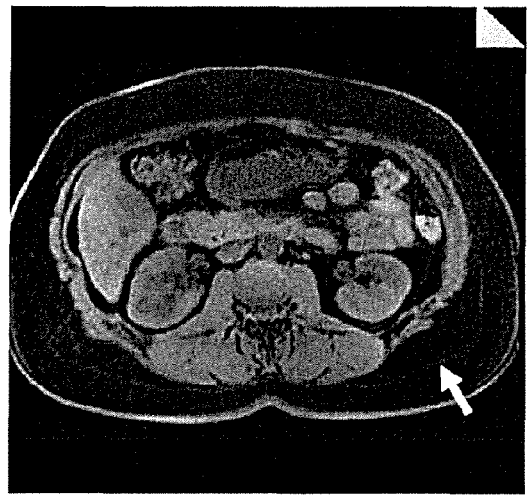
FIGS. 7(a) and 7(b) show images captured using an MRI sequence provided with an optimized spectrum suppression pulse according to the present invention.
Figure 7B:
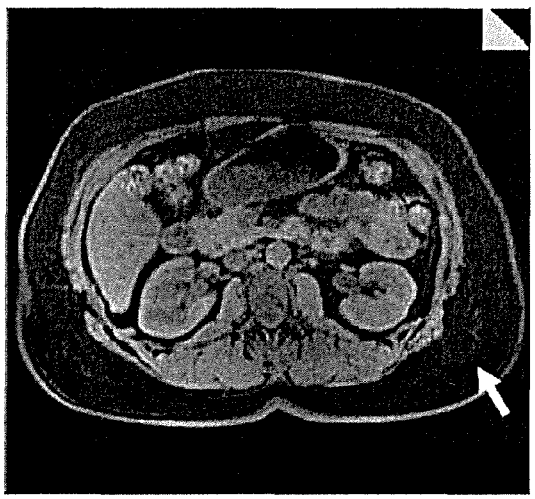
Figure 7C:
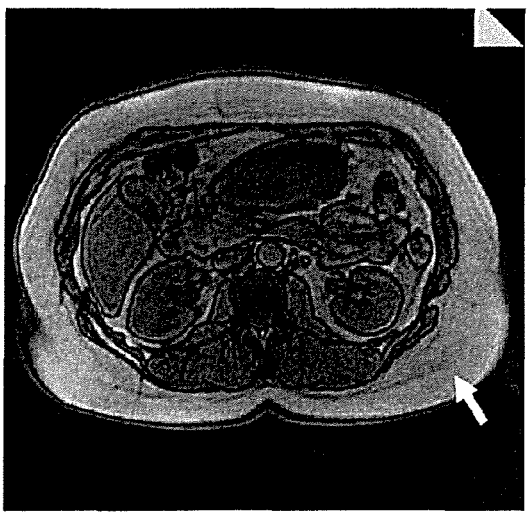
FIG. 7(c) shows an image captured using an MRI sequence not provided with a spectrum suppression pulse.

FIGS. 7(a) and 7(b) show the images formed using an MRI sequence provided with an optimized spectrum suppression pulse according to the present invention. In particular, FIG. 7(a) shows an image captured when the spectrum suppression pulse is a FatSat fat suppression pulse, the number of k-space filling lines corresponding to each FatSat pulse train is 32 lines, and the calculated FatSat flip angle=153°; and FIG. 7(b) shows an image captured when the spectrum suppression pulse is a SPAIR fat suppression pulse, the number of k-space filling lines corresponding to each SPAIR pulse train is 32 lines, and it is calculated that TrFill=0 and TIFill=62.3 ms. FIG. 7(c) shows an image captured using an MRI sequence not provided with a spectrum suppression pulse. The images shown in FIGS. 7(a)-7(c) are all obtained using a short T1 spoiled 3D gradient echo sequence, and all require volunteers to hold breath in tests to eliminate motion artifacts.

Arrows below FIGS. 7(a)-7(c) all indicate the subcutaneous area. As shown in FIG. 7(c), when fat suppression is not performed, the subcutaneous area displays fat signals in high luminance. However, the corresponding areas in FIGS. 7(a) and 7(b) are displayed as low dark signals. Therefore, the spectrum suppression pulse optimization method according to the present invention can work well for FatSat and SPAIR techniques.

Although modifications and changes may be suggested by those skilled in the art, it is the intention of the inventor to embody within the patent warranted hereon all changes and modifications as reasonably and properly come within the scope of the inventor's contribution to the art.

I claim as my invention:

1. A method for acquiring magnetic resonance data, comprising:

in a processor, automatically calculating a flip angle and/or inversion time of a spectrum suppression pulse according to a steady state condition of a longitudinal magnetization component of a spectrum composition suppressed by a spectrum suppression pulse, to be generated in a magnetic resonance imaging sequence, and a zero crossing point condition of the longitudinal magnetization component;

operating a magnetic resonance data acquisition unit to acquire magnetic resonance data by applying said magnetic resonance imaging sequence comprising the spectrum suppression pulse provided with the flip angle and/or the inversion time, to a subject in the data acquisition unit;

entering said magnetic resonance data into memory locations in an electronic memory organized as k-space, and making k-space filled with said magnetic resonance data available in electronic form as a data file from said memory in a format suitable for further processing;

emitting the spectrum suppression pulse in the magnetic resonance imaging sequence before one or more excitation pulses and using, as the zero crossing point condition of the longitudinal magnetization component, making the longitudinal magnetization component of the spectrum composition zero before an excitation pulse corresponding to a center line of k-space; and the inversion time comprising a first inversion time and a second inversion time, and calculating the flip angle or the inversion time of the spectrum suppression pulse, using a general formula, and the flip angle or the inversion time of the spectrum suppression pulse, wherein said general formula is:

$$\{E+F \cdot C \cdot (D^{N-1}-1)/(D-1)+F \cdot A \cdot D^{N-1}\}/(1-F \cdot B \cdot D^{N-1})$$
$$=\{C \cdot (D^{KSpaceCenterLine-1}-1)/(D-1)+$$
$$A \cdot D^{KSpaceCenterLine-1}\}/(-B \cdot D^{KSpaceCenterLine-1}),$$

where, $A=1-E_{TI1}$
$B=\cos(\beta) \cdot E_{TI1}$
$C=1-E_{Trep}$
$D=\cos(\alpha) \cdot E_{Trep}$
$E=1-E_{Tr}$
$F=\cos(\alpha) \cdot E_{Tr}$
$E_{TI1}=\exp(-TI1/T1)$
$E_{Trep}=\exp(-Trep/T1)$
$E_{Tr}=\exp(-Tr/T1)$ TI1=TI1Min+TIFill
Tr=TrMin+TrFill
α is a flip angle of an excitation pulse,
β is a flip angle of a spectrum suppression pulse,
T1 is a longitudinal relaxation time of a spectrum composition suppressed by a spectrum suppression pulse,
N is the number of excitation pulses between two spectrum suppression pulses,
KSpaceCenterLine is the index number of a the center line of k-space,
TI1Min is the minimum time interval between the center of a spectrum suppression pulse and the center of a first excitation pulse following the spectrum suppression pulse,
Trep is the time between continuous excitation pulses,
TrMin is the minimum time interval between the center of the last excitation pulse in a pulse train and the center of a spectrum suppression pulse in a next pulse string of the magnetic resonance imaging sequence,
TIFill is the first inversion time, and
TrFill is the second inversion time.

2. A method as claimed in claim 1, further comprising setting the first inversion time TIFill and the second inversion time TrFill as 0, and calculating the flip angle β in the step of calculating the flip angle or the inversion time of the spectrum suppression pulse.

3. A method as claimed in claim 1, further comprising:
setting the flip angle β as 180 degrees; and
calculating the flip angle or the inversion time of the spectrum suppression pulse by setting the second inversion time TrFill as 0, and calculating the first inversion time TIFill.

4. A method as claimed in claim 3, wherein, when the calculated first inversion time TIFill is smaller than 0, calculating the flip angle or the inversion time of the spectrum suppression pulse further by:
setting the first inversion time TIFill as 0, and
calculating the second inversion time TrFill.

5. A method as claimed in claim 1, comprising: setting the flip angle β as 180 degrees; and
the step of calculating the flip angle or the inversion time of the spectrum suppression pulse by setting the first inversion time TIFill as 0, and calculating the second inversion time TrFill.

6. A method as claimed in claim 5, wherein, when the calculated second inversion time TrFill is smaller than 0, calculating the flip angle or the inversion time of the spectrum suppression pulse further by:
setting the second inversion time TrFill as 0, and
calculating the first inversion time TIFill.

7. A magnetic resonance apparatus comprising:
a magnetic resonance data acquisition unit;
a processor configured to automatically calculate a flip angle and/or inversion time of a spectrum suppression pulse according to a steady state condition of a longitudinal magnetization component of a spectrum composition suppressed by a spectrum suppression pulse, to be generated in a magnetic resonance imaging sequence, and a zero crossing point condition of the longitudinal magnetization component;
a control unit configured to operate the magnetic resonance data acquisition unit to acquire magnetic resonance data by applying said magnetic resonance imaging sequence comprising the spectrum suppression pulse provided with the flip angle and/or the inversion time, to a subject in the data acquisition unit;
said control unit being configured to enter said magnetic resonance data into memory locations in an electronic memory organized as k-space, and to make k-space filled with said magnetic resonance data available in electronic form as a data file from said memory in a format suitable for further processing;
said control unit being configured to operate said magnetic resonance data acquisition unit to emit the spectrum suppression pulse in the magnetic resonance imaging sequence before one or more excitation pulses and using, as the zero crossing point condition of the longitudinal magnetization component, making the longitudinal magnetization component of the spectrum composition zero before an excitation pulse corresponding to a center line of k-space; and
the inversion time comprising a first inversion time and a second inversion time, and wherein said control unit is configured to calculate the flip angle or the inversion time of the spectrum suppression pulse, using a general formula, and the flip angle or the inversion time of the spectrum suppression pulse, wherein said general formula is:

$$\{E+F \cdot C \cdot (D^{N-1}-1)(D-1)+F \cdot A \cdot D^{N-1}\}/(1-F \cdot B \cdot D^{N-1})$$
$$=\{C \cdot (D^{KSpaceCenterLine-1}-1)/(D-1)+$$
$$A \cdot D^{KSpaceCenterLine-1}\}/(-B \cdot D^{KSpaceCenterLine-1}),$$

where,
$A=1-E_{TI1}$
$B=\cos(\beta) \cdot E_{TI1}$
$C=1-E_{Trep}$
$D=\cos(\alpha) \cdot E_{Trep}$
$E=1-E_{Tr}$
$F=\cos(\alpha) \cdot E_{Tr}$
$E_{TI1}=\exp(-TI1/T1)$
$E_{Trep}=\exp(-Trep/T1)$
$E_{Tr}=\exp(-Tr/T1)$
TI1=TI1Min+TIFill
Tr=TrMin+TrFill
α is a flip angle of an excitation pulse,
β is a flip angle of a spectrum suppression pulse,
T1 is a longitudinal relaxation time of a spectrum composition suppressed by a spectrum suppression pulse,
N is the number of excitation pulses between two spectrum suppression pulses,
KSpaceCenterLine is the index number of a the center line of k-space,
TI1Min is the minimum time interval between the center of a spectrum suppression pulse and the center of a first excitation pulse following the spectrum suppression pulse,
Trep is the time between continuous excitation pulses,
TrMin is the minimum time interval between the center of the last excitation pulse in a pulse train and the center of a spectrum suppression pulse in a next pulse string of the magnetic resonance imaging sequence,
TIFill is the first inversion time, and
TrFill is the second inversion time.

* * * * *